United States Patent
Polnyi

(10) Patent No.: US 7,614,900 B1
(45) Date of Patent: Nov. 10, 2009

(54) IC SOCKET WITH DUAL ACTUATING MECHANISMS

(75) Inventor: Igor Polnyi, Aurora, IL (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/221,693

(22) Filed: Aug. 5, 2008

(51) Int. Cl.
*H01R 12/00* (2006.01)

(52) U.S. Cl. .................. 439/342; 439/70; 439/260; 439/331

(58) Field of Classification Search ............ 439/73, 439/260, 261, 299, 330, 331, 342
See application file for complete search history.

(56) References Cited

U.S. PATENT DOCUMENTS

| | | | | |
|---|---|---|---|---|
| 5,002,499 A | * | 3/1991 | Matsuoka | 439/342 |
| 5,597,320 A | * | 1/1997 | Wang et al. | 439/342 |
| 6,338,639 B1 | * | 1/2002 | Trout et al. | 439/342 |
| 6,361,345 B1 | * | 3/2002 | Tan | 439/342 |
| 6,991,474 B1 | * | 1/2006 | Ju | 439/73 |
| 7,402,053 B2 | * | 7/2008 | Hougham et al. | 439/70 |
| 2002/0019159 A1 | * | 2/2002 | Trout et al. | 439/342 |
| 2004/0219818 A1 | * | 11/2004 | Ye et al. | 439/342 |
| 2005/0020118 A1 | * | 1/2005 | Norris et al. | 439/342 |
| 2005/0032409 A1 | * | 2/2005 | Abe | 439/342 |
| 2005/0142920 A1 | * | 6/2005 | Hashimoto | 439/342 |
| 2006/0172581 A1 | * | 8/2006 | Hao | 439/342 |
| 2008/0026628 A1 | * | 1/2008 | Hougham et al. | 439/342 |

* cited by examiner

*Primary Examiner*—James Harvey
(74) *Attorney, Agent, or Firm*—Andrew C. Cheng; Wei Te Chung; Ming Chieh Chang

(57) ABSTRACT

An IC socket comprises a base defining a plurality of passageways, a cover attached to the base and two actuating mechanisms disposed between the base and the cover. The cover has a plurality of apertures corresponding to the passageways. The two actuating mechanisms are disposed between the base and the cover to driving the cover moving along the base simultaneously.

10 Claims, 5 Drawing Sheets

IC SOCKET WITH DUAL ACTUATING MECHANISMS

BACKGROUND OF THE INVENTION

1. Field of the Invention

The present invention relates to an integrated circuit (IC) socket, especially to a pin grid array (PGA) socket with actuating mechanisms to redistribute the actuating force during actuation.

2. Description of the Prior Art

A PGA socket is used for electrically connecting an IC to a circuit substrate, such as a printed circuit board. The PGA socket typically comprises a base supporting a plurality of contacts, a cover including a plurality of insertion holes, and an actuating mechanism disposed between the base and the cover. The base is mounted on the circuit substrate to form an electrical connection with circuits on the circuit substrate. The cover is attached to the base prior to assemble to the circuit substrate.

Typical PGA socket comprises low insertion force (LIF) and zero insertion force (ZIF) PGA sockets adapt for reducing insertion force when terminals of the IC are inserted into the sockets. In order to establish an electrical connection between the contacts and the terminals, the terminals of the IC are inserted into the insertion holes of the cover as the actuating mechanism in an open position, in other words an actuating portion of the actuating mechanism is perpendicular to the cover. The cover and the IC are movable relative to the base in horizontal direction until push the actuating mechanism from the open position to a close position. An actuation force is generated while the terminals against the contacts to form an electrical connection. As well-known that developing trend of electronic element is small size and high speed. To adapt to this trend, the number and the density of the contacts need to increase. Accordingly, the actuation force between the IC and the socket are increased. Therefore, for actuating an IC socket with more contacts and higher density, it would require much higher actuation force. Thus the actuating mechanism has to be stronger which result in the PGA socket height growth.

In order to increase the number of the contacts per socket and keep a low socket profile, there is a need for a ZIF PGA socket to provide a bigger actuation force.

SUMMARY OF THE INVENTION

Accordingly, an object of the present invention is to provide an IC socket with an improved actuating mechanism that can supply stronger actuation force to remove a cover along the lateral surface of a base.

In order to achieve the object set forth, an IC socket comprises a base defining a plurality of passageways, a cover attached to the base and two actuating mechanisms disposed between the base and the cover. The cover has a plurality of apertures corresponding to the passageways. The two actuating mechanisms are disposed between the base and the cover to driving the cover moving along the base simultaneously.

In order to further achieve the object set forth, a socket comprises a base having two receiving portions and a supporting portion connected therewith, and a cover having two head portions corresponding to the receiving portions and a main body located therebetween. Each receiving portion of the base and the corresponding head portion of the cover define a accommodate portion. The two actuating mechanism are disposed in the accommodate portions respectively for actuating the cover to slide along the base in a horizontal direction from an open position to a close position.

DESCRIPTION OF PREFERRED EMBODIMENT

Reference will now be made to the drawings to describe the present invention in detail.

Figure 1:
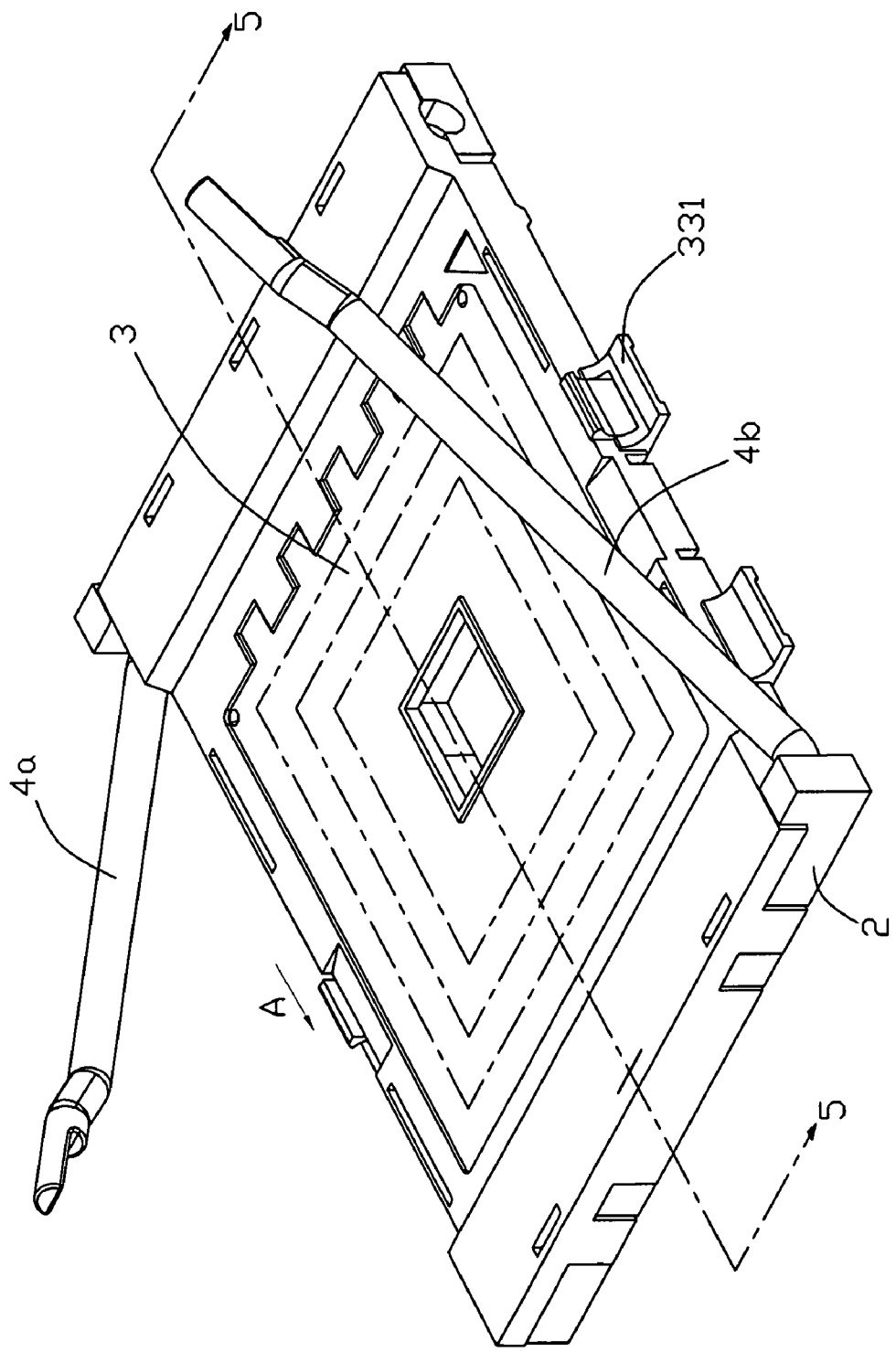
FIG. 1 is an assembled view of an IC socket in accordance with the present invention.
Figure 2:
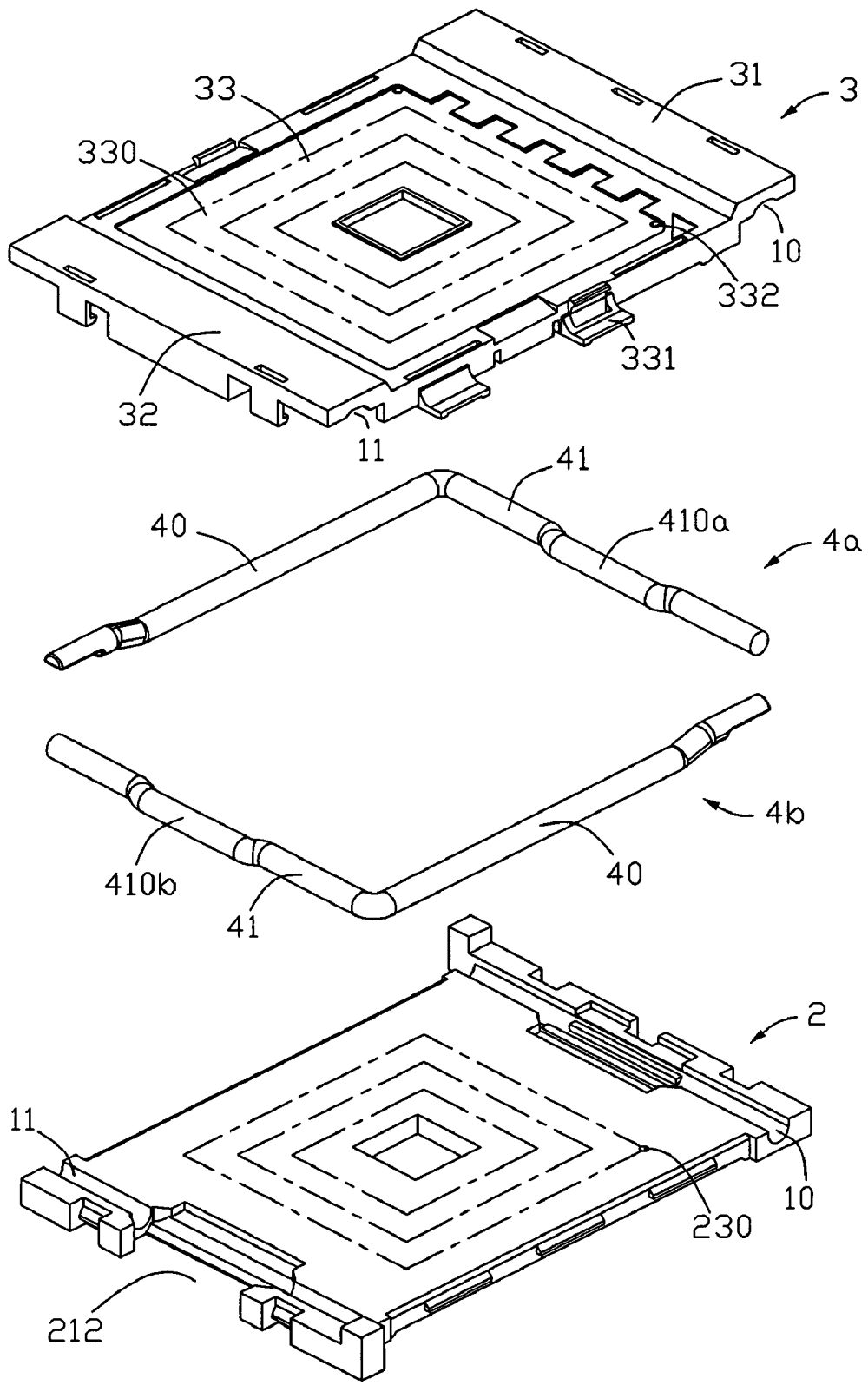
FIG. 2 is an exploded view of the IC socket of FIG. 1.

Referring to FIG. 1 and FIG. 2, an IC socket is used for electrically connecting an IC chip (not shown) and a printed circuit board (not shown) and includes a base 2, a cover 3 slidably mounted on the base 2, and a pair of actuating mechanisms disposed between the base 2 and the cover 3 for actuating the cover 3 to move relative to the base 2.

The actuating mechanisms in the present embodiment are a pair of levers 4a, 4b. Each of the lever 4a, 4b is formed in an L shape and comprises an actuating portion 40 and a retaining portion 41. Each retaining portion 41 of the levers 4a, 4b has a cam portion 410a, 410b at a middle portion thereof. The actuating portions 40 and the retaining portion 41 of the two levers 4a, 4b are opposite to each other. The cam portion 410a, 410b are all located in a left side relative to the retaining portion 41 of the same lever at a close position.

Figure 3:
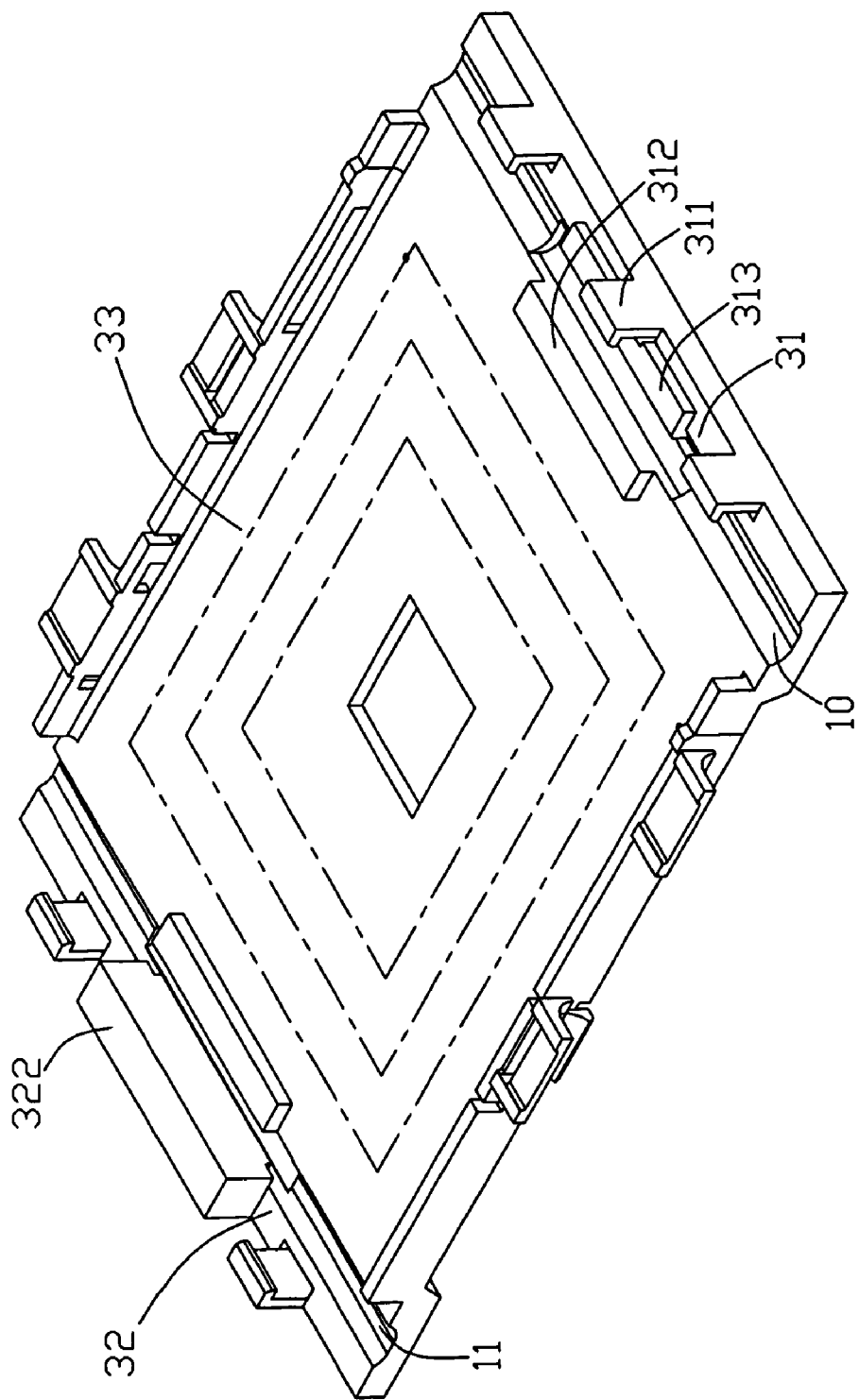
FIG. 3 is an isometric view of a cover in accordance with the present invention from bottom.

Referring to FIG. 3, the cover 3 is configured as a substantially rectangular shape and comprises two head portions and a main body 33 connected the two head portions. The main body 33 forms a recess 330 on a top surface thereof for receiving the IC chip and a plurality of locking members 331 on opposite sidewalls (not labeled) thereof to lock the levers 4a, 4b on the close position. The main body 33 has a plurality of apertures 332 (only shown partly of the apertures) used to accommodate terminals of the IC chip. The two head portions are named the first head portion 31 and second head portion 32 respectively.

Figure 4:
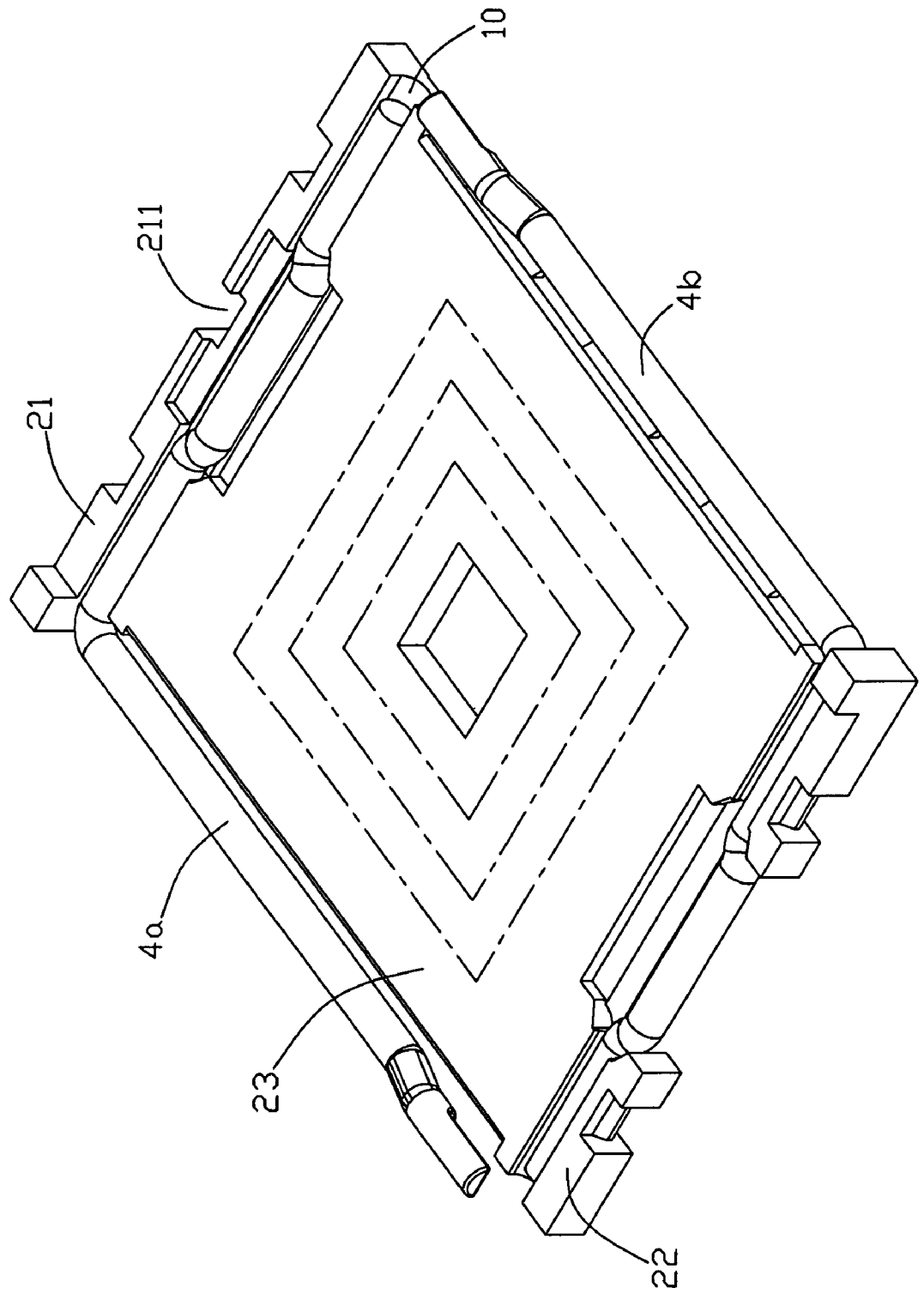
FIG. 4 is an isometric view of a pair of levers disposed on a base in accordance with the present invention.

Referring to FIG. 4, the base 2 comprises a first and second receiving portion 21, 22 and a supporting portion 23 connected with the first and second receiving portions 21, 22. The supporting portion 23 defines a plurality of passageways 230 for accommodating the contacts. The head portions 31, 32 and the receiving portions 21, 22 cooperate to define two through openings 10, 11 perpendicular to the sidewalls of the cover 3. The levers 4a, 4b are disposed in the openings 10, 11 respectively and rotate therein for actuating the cover 3 to move along the base 2.

The cover 3 is moveable mounted on the base 2. The first and second head portions 31, 32 of the cover 3 form a plurality of latches 311 extending downwardly toward the base 2. Accordingly, the first and second receiving portions 21, 22 of the base 2 have latch slots 211 for engaging with the latches 311. The second receiving portion 22 of the base 2 has a gap 212 between the latch slots 211. The gap 212 is communicated with the opening 11. Adjacent the openings 10, 11 of the cover 3, the cover 3 has protrusions 312, 322 for providing an actuating surface to the cam portions 410a, 410b of the levers 4a, 4b. The first head portion 31 has another protrusion 313 adjacent to the opening 10 and opposite to the protrusion 312.

Figure 5A:
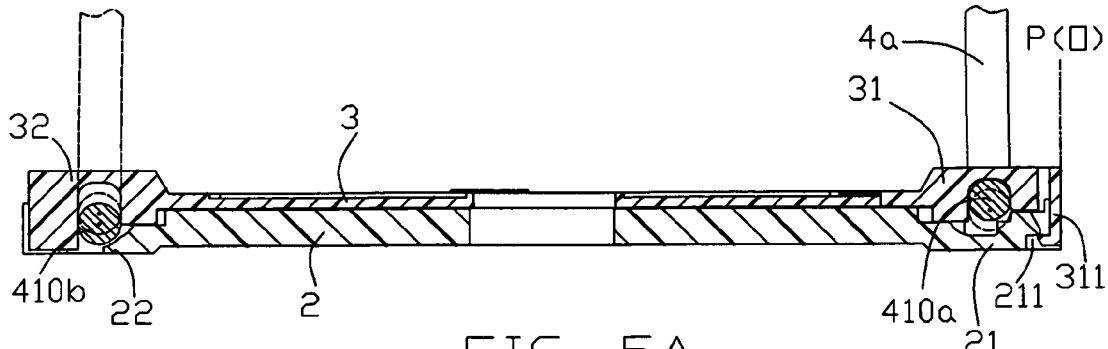
FIG. 5A is a section view taken along line 5-5 of FIG. 1, wherein the levers are both in a close position.
Figure 5B:
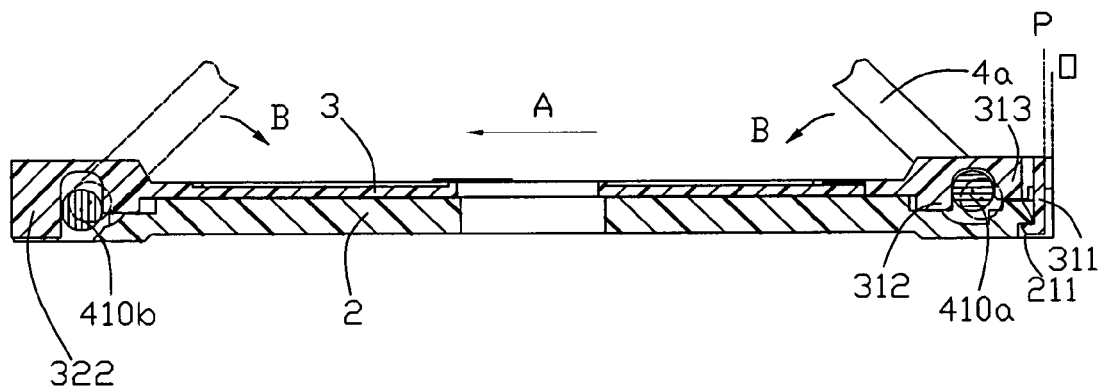
FIG. 5B is a section view taken along line 5-5 of FIG. 1, showing the levers are pulled in a position between the close position and an open position.
Figure 5C:
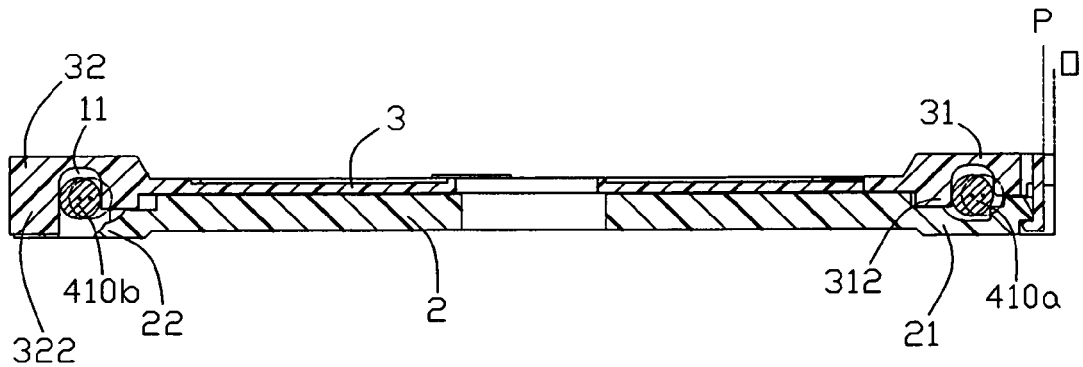
FIG. 5C is a section view taken along line 5-5 of FIG. 1, wherein the levers are both in the open position.

FIG. 5A to FIG. 5C show processes that the levers 4a, 4b actuate the cover 3 from an open position to the close position. As in FIG. 5A, the levers 4a, 4b are both in the open position, and now, edge of the first head portion 31 of the cover 3 is on line P and the line P is common to the edge of the first receiving portion 21 of the base 2 on line O. The axis of the cam portion 410a is above the axis of the retaining portion 41 of the lever 4a and the axis of the cam portion 410b is below the axis of the lever 4b. As shown in FIG. 5B (also can see FIG. 1), rotate the lever 4a in an anticlockwise direction and rotate the lever 4b in a clockwise direction as arrow B simultaneously, the cam portions 410a, 410b of the levers 4a, 4b are against the protrusions 312, 322 of the cover 3 and drive the cover 3 to slide along a top surface of the base 2 in a direction shown by arrow A, now, the line P and the line O has a distance therebetween. Continue to rotate the levers 4a, 4b to the close position as shown in FIG. 5C, the cam portions 410a, 410b are both in a direction as arrow A relative to their retaining portions 41 of the levers 4a, 4b and the actuating portion 40 are located by the locking portions 331 of the cover 3. The distance of the line P and line O is larger than the distance of as the FIG. 5B shown.

During driving the levers 4a, 4b from the close position to the open position, the lever 4b rotate in an anticlockwise direction and the lever 4a rotate in a clockwise direction simultaneously. The cam portion 410b of the lever 4b accommodate to the gap 212 of the base 2 and not drives the cover 3, while the cam portion 410a of the lever 4a drives the protrusion 313 of the cover 3 to slide in a direction opposite to the arrow A.

It should be point out that, the actuating mechanism is not limited in the lever, it also can be a circle eccentric cam, the cams are positioned in opposite end of socket and simultaneously rotate in opposite directions. The principle is the same with the levers.

Although the present invention has been described with reference to particular embodiments, it is not to be construed as being limited thereto. Various alterations and modifications can be made to the embodiments without in any way departing from the scope or spirit of the present invention as defined in the appended claims. For example, in the current embodiment the two actuating mechanisms are designedly operate simultaneously. Understandably, in other embodiment, the two actuating mechanisms may be arranged to operate successively. Under that situation, the cam of each actuating mechanism is arranged to be between a relaxed position not to engage the cover for allowing the other mechanism to independently operate the cover to move, and an operation position to engage the cover for self-operating the cover to move. For example, for the socket as shown in U.S. Pat. No. 6,500,019, the two cams could be located at two opposite ends of the socket, and each cam can be arranged in upper and lower positions in a vertical position via a supporting spring thereunder, wherein in the upper position the cam is not engaged with the cover but allowing the cover to pass if the cover is actuated by the other cam, and in the lower position the cam is engaged with the cover so as to directly actuate the cover to move. This arrangement allows non-simultaneous operations of the two cam. Understandably, in the embodiment under simultaneous operation, the force applied to each cam can be reduced to a half in comparison with the conventional single cam structure. On the other hand, in the embodiment under successive operation, the force applied to each cam is also reduced to a half because each cam is only responsible for one half way of the original stroke, i.e., one cam actuating the cover to move with a front half stroke and the other cam actuating the cover to move with the rear half stroke. This force-saving effect is like the half/fine pitch vs. the one pitch.

What is claimed is:

1. A socket comprising:
    a base having first and second receiving portion and a supporting portion connected therewith;
    a cover having and second head portions corresponding to the receiving portions and a main body located therebetween, each receiving portion of the base and the corresponding head portion of the cover defining an accommodating portion; and
    two actuating mechanisms disposed in the accommodating portions respectively for actuating the cover to slide along the base in a horizontal direction from an open position to a close position.

2. The socket as claimed in claim 1, wherein the actuating mechanism is a cam.

3. The socket as claimed in claim 1, wherein each actuating mechanism is an L shape lever and includes an actuating portion and a retaining portion with a cam portion formed thereon, and wherein the actuating portions and the retaining portions of said two levers are opposite to each other.

4. The socket as claimed in claim 3, wherein the cam portions are located in a same side relative to the retaining portions of the same lever at the closed position.

5. The socket as claimed in claim 4, wherein the cam portions of the levers have a same displacement relative to the base in the horizontal direction.

6. The socket as claimed in claim 5, wherein each accommodating portion defines a through opening for receiving the retaining portion of the lever.

7. The socket as claimed in claim 6, wherein each receiving portion of the base includes a plurality of engagement slots adjacent to the opening, and wherein each head portion of the cover includes a plurality of latches attached to the engagement slots of the corresponding receiving portion.

8. The socket as claimed in claim 7, wherein the second receiving portion of the base has a gap extending toward and connected the opening, the second head portion of the cover has a protrusion extending downwardly and received into the gap.

9. The socket as claimed in claim 8, wherein the first head portion of the cover has a protrusion in the same side of the protrusion defined in the second head portion.

10. The socket as claimed in claim 9, wherein rotate one lever in a clockwise direction against the protrusion of the second head portion to push and move the cover in a direction, and simultaneously rotate the other lever in a anticlockwise direction against the protrusion of the first head portion to push and move the cover in the same direction.

* * * * *